United States Patent [19]

Dickinson

[11] Patent Number: 5,072,184
[45] Date of Patent: Dec. 10, 1991

[54] MAGNETIC RESONANCE METHODS AND APPARATUS

[75] Inventor: Robert J. Dickinson, Harrow, England

[73] Assignee: Picker International, Ltd., Wembley, England

[21] Appl. No.: 372,926

[22] Filed: Jun. 29, 1989

[30] Foreign Application Priority Data

Jul. 6, 1988 [GB] United Kingdom ............... 8816071

[51] Int. Cl.$^5$ .......................................... G01R 33/20
[52] U.S. Cl. ................................................. 324/318
[58] Field of Search ............... 324/307, 309, 318, 322, 324/314; 128/653 SC

[56] References Cited

U.S. PATENT DOCUMENTS

| | | | |
|---|---|---|---|
| 4,095,163 | 6/1978 | Hlavka | 324/318 |
| 4,607,226 | 8/1986 | Zeiger | 324/318 |
| 4,714,887 | 12/1987 | Meissner et al. | 324/322 |
| 4,793,356 | 12/1988 | Misic et al. | 324/318 |
| 4,816,765 | 3/1989 | Boskamp | 324/318 |

FOREIGN PATENT DOCUMENTS

| | | |
|---|---|---|
| 0084946 | 8/1983 | European Pat. Off. |
| 0200078 | 12/1986 | European Pat. Off. |
| 2137757 | 10/1984 | United Kingdom |
| 2149124 | 6/1985 | United Kingdom |

OTHER PUBLICATIONS

"Planar-pair local coils for high-resolution magnetic resonance imaging, particularly of the temporomandibular joing", Medical Physics, vol. 13(1), Jan./Feb. 1986, pp. 3 to 7; James S. Hyde et al.
"A Suirface Coil Geometry with Field Pattern Entirely on X-Y Plane for Optimum Patient Loading:", SMRM Abstracts, Aug. 1987, p. 413; Mehrdad Mehdizadeh, PhD., et al.

Primary Examiner—Michael J. Tokar
Assistant Examiner—Louis M. Arana
Attorney, Agent, or Firm—Timothy B. Gurin

[57] ABSTRACT

A coil (17) for use as a surface r.f. coil in magnetic resonance apparatus comprising a conductor (25) wound helically to form a coil of overall laminar form with the parts of the conductor on one main face (29) more closely spaced to one another than are the parts of the conductor on the other main face (31). The coil is used to induce or detect an r.f. field locally in a body under investigation by positioning it with the main face having the more closely spaced conductor parts adjacent the body. The closer spacing improves coupling to the body while allowing the coil to be thinner, and therefore less bulky, than a coil of comparable performance with the same conductor part spacing on both main faces.

12 Claims, 2 Drawing Sheets

MAGNETIC RESONANCE METHODS AND APPARATUS

This invention relates to magnetic resonance methods and apparatus.

More especially the invention relates to radio frequency (r.f.) coils for use in such methods and apparatus.

In magnetic resonance methods and apparatus a static magnetic field is applied to the body under investigation to define an equilibrium axis of magnetic alignment in the region of the body being examined. A radio frequency field is then applied to the region being examined in a direction orthogonal to the static magnetic field direction, to excite magnetic resonance in the region, and resulting r.f. signals are detected and processed.

The exciting r.f. field is applied and resulting signals are detected by r.f. coils placed adjacent the body. Normally separate coils are used for excitation and detection but the same coil or coils may be used for both purposes.

For many types of investigation the r.f. coils may be in the form of a loop arranged to produce and/or detect a field in a direction perpendicular to the plane of the loop.

However, in some types of investigation such r.f. coils are not satisfactory in that they cannot easily be positioned to produce a field in the required direction relative to the static field, or can only be so positioned at a relatively great distance from the region of interest. This problem arises, for example, in the case of magnetic resonance imaging of the spine of a patient lying on his back using a vertically directed static field when the physical constraints dictate the placing of loop r.f. field coils on the left and/or right hand sides of the patient, i.e. some distance from the patient's spine.

To overcome this problem the use of so-called surface r.f. coils has been proposed. Such coils are designed so as to be suitable for positioning adjacent a surface of the body being examined near the region to be imaged, and to produce or detect fields directed generally parallel to their major surfaces.

It is an object of the present invention to provide a surface r.f. coil for use in magnetic resonance apparatus which is capable of more efficient operation than comparable known surface r.f. coils.

It is a further object of the invention to provide a magnetic resonance apparatus and method utilizing an improved form of surface r.f. coil.

According to a first aspect of the present invention there is provided a coil for use as an r.f. coil in a magnetic resonance apparatus comprising a conductor wound helically to form a coil of laminar overall form with the parts of the conductor on one main face thereof more closely spaced to one another than are the parts of the conductor on the other main face thereof by an amount more than arises due to any curvature of the main faces.

According to a second aspect of the present invention there is provided a magnetic resonance apparatus comprising: means for generating a static magnetic field to define an equilibrium axis of magnetic alignment in a region of a body to be examined using the apparatus; and an r.f. coil of laminar overall form comprising a conductor wound helically to form said coil, said coil being positioned with a main face closely adjacent a surface of the body adjacent said region with its axis substantially orthogonal to the direction of said static magnetic field.

In such an arrangement said coil is preferably a coil according to the first aspect of the invention and is positioned with said one main face closely adjacent said surface of the body.

According to a third aspect of the present invention there is provided a method of examining a region of a body using a magnetic resonance technique comprising disposing the body in a static magnetic field; positioning alongside said body a coil of laminar form comprising a conductor wound helically to form said coil, said coil being positioned with a main face closely adjacent a surface of the body adjacent said region with its axis substantially orthogonal to the direction of said static magnetic field; and utilizing said coil to excite and/or detect magnetic resonance in said region.

In such a method said coil is preferably a coil according to the first aspect of the invention and said positioning step comprises positioning said coil with said one main face closely adjacent said surface of the body.

One r.f. coil and a method and apparatus in accordance with the invention will now be described by way of example with reference to the accompanying drawings in which.

Figure 1:
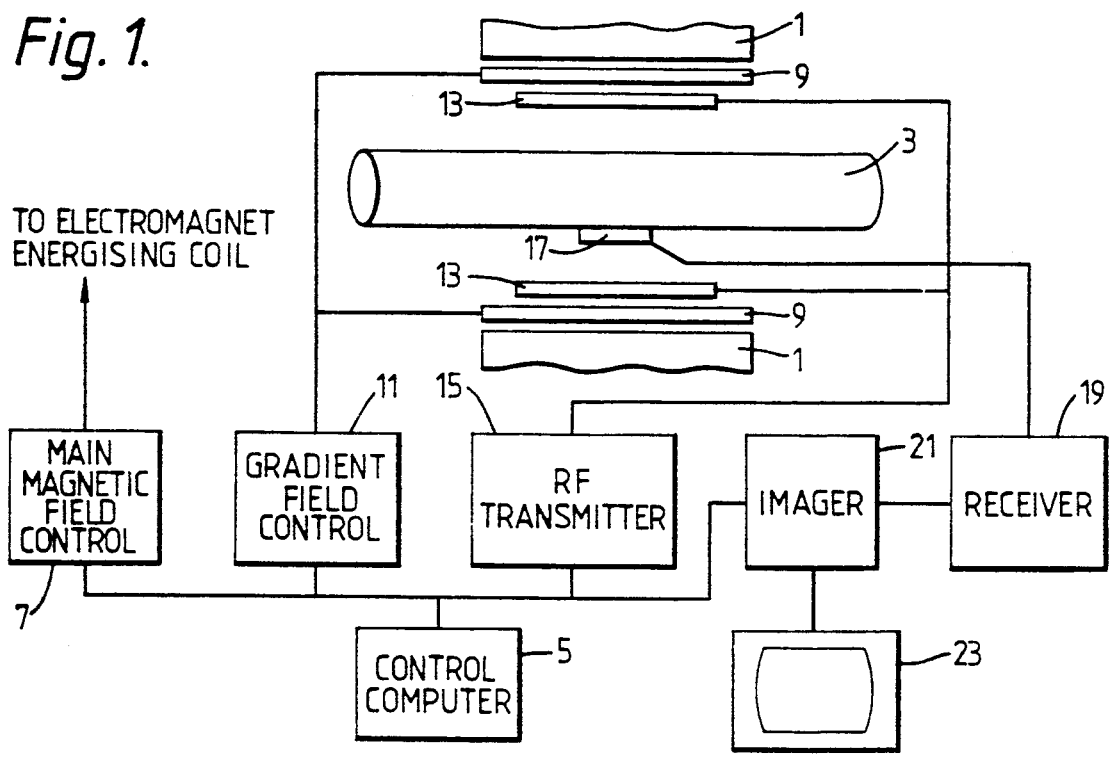
FIG. 1 is a schematic diagram of the apparatus.

Referring to FIG. 1, the apparatus, which is a magnetic resonance imaging apparatus, includes an electromagnet which produces a strong uniform static main magnetic field across a gap between two pole pieces 1 of the electromagnet, the pole pieces 1 being joined by a yoke (not shown) carrying an energising coil (not shown). In use of the apparatus an elongated body 3 to be imaged is placed in the gap between the pole pieces 1 on a suitable support (not shown) with the longitudinal axes of the body 3 extending orthogonal to the direction of the magnetic field in the gap. The strength of the field in the gap between the pole pieces 1, and hence in the body 3, is controlled by a computer 5 via a main magnet control means 7 which controls the supply of energising current to the electromagnet energising coil.

The apparatus further includes a gradient coil system 9 whereby a gradient may be imposed on the static magnetic field in the gap between the pole pieces 1 in any one or more of three orthogonal directions. The coil system 9 is energised by a gradient field control means 11 under control of the computer 5.

The apparatus further includes an r.f. transmitting coil system 13 energised by an r.f. transmitter 15 under control of the computer 5 to apply an r.f. field to the body 3.

The apparatus further includes an r.f. receiving coil 17 arranged to detect r.f. signals resulting from magnetic resonance excited in the body 3. The detected signals are passed via a receiver 19 to an imager 21 which under control of the computer 5 processes the signals to produce signals representing an image of the body 3. These signals are, in turn, passed to a display device 23 to provide a visual display of the image.

In operation of the apparatus the field provided by the electromagnet defines an equilibrium axis of magnetic alignment in the body 3.

To obtain an image of a selected region, e.g. a cross-sectional slice of the body, an r.f. field pulse is first applied to the body 3 by means of the coil system 13 to excite magnetic resonance in the selected region. To this end the coil system 13 produces a field in a direction orthogonal to the static field direction so as to tip the spins of nuclei in the selected region from the direction of the static field into a plane orthogonal to the static field direction. To restrict excitation to the selected region the r.f. field pulse is applied in conjunction with magnetic field gradients imposed by the coil system 9, the frequency of the r.f. field being chosen in conjunction with the magnitudes and directions of the imposed gradients so that the Larmor frequency of chosen protons in the body, e.g. hydrogen protons, is equal to the r.f. field frequency only in the selected region.

The r.f. signals resulting from excitation are then spatially encoded by application of one or more further gradient magnetic fields in known manner, detected by the r.f. receiving coil 17 and processed to produce an image.

Normally a number of excitation and signal detection sequences are required to produce sufficient data to produce a satisfactory image.

The r.f. receiving coil 17 is positioned adjacent to, preferably in contact with, a part of the surface of the body 3 close to the region to be imaged.

Figure 2:
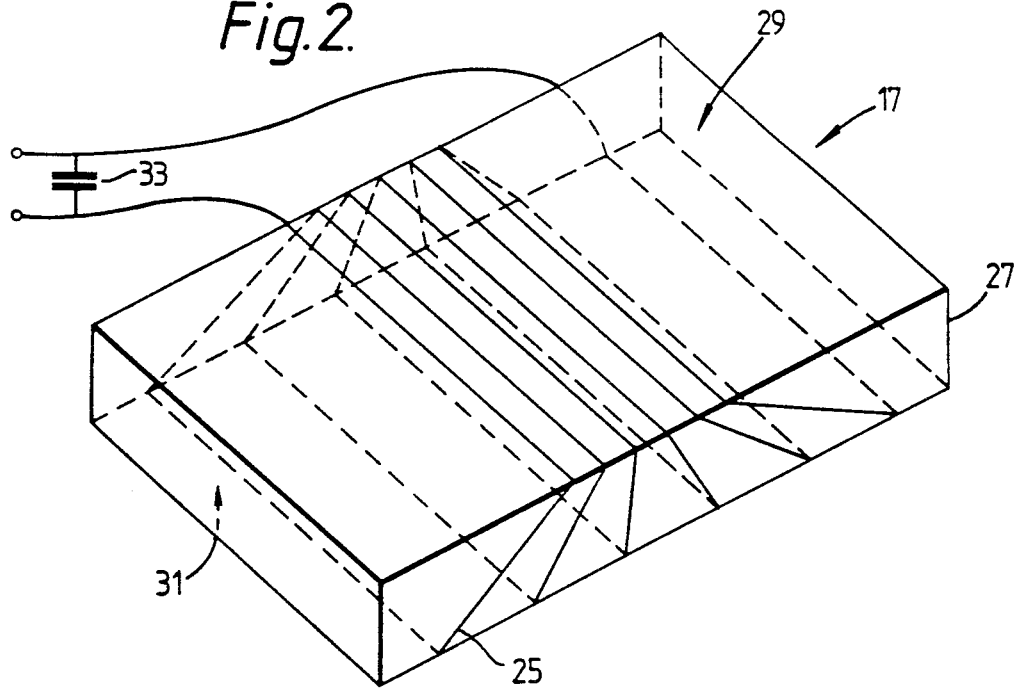
FIG. 2 is a diagrammatic perspective view of an r.f. coil of the apparatus.

Referring to FIG. 2, the coil 17 comprises a conductor 25 wound helically around a thin flat rectangular coil former 27. The turns of the winding are arranged so that the parts of the conductor 25 on one main face 29 of the former 27, and hence of the coil, are more closely spaced to one another than are the parts of the conductor 25 on the other main face 31 of the former 27, and hence of the coil, and so that the parts of the conductor 25 on both main faces 29, 31 are parallel to one another and orthogonal to the longer edges of the main faces 28, 31. The ends of the conductor 25 are connected to the receiver 19 by a tuning and impedance matching circuit indicated diagrammatically by capacitor 33.

The coil 17 is positioned with the face 29 of the former 27 adjacent the appropriate part of the surface of the body 3, with the axis of the coil 17 orthogonal to the direction of the static magnetic field so that changes in the magnetic field in the body 3 adjacent the coil 17 in a direction orthogonal to the direction of the static magnetic field, e.g. the r.f. field resulting from the excited magnetic resonance, induces a voltage in the coil 17.

The relatively close spacing of the parts of the conductor 25 on the side of the coil 17 adjacent the body 3 improves the coupling between the coil 17 and the field in the body 3. Thus the coupling between the coil 17 and the field is tighter than would be the case if the spacing on both faces 29, 31 were the same as on face 29, or as on face 31.

It will be noted in this connection that whilst a coil having the same close spacing of parts of the conductor 25 on face 31 of the former 27 as on face 29 of the former 27 would be capable of being as tightly coupled to the field in the body 3 as the coil shown in FIG. 2, this could only be achieved by increasing the thickness of the former 27, i.e. the spacing of faces 29 and 31, so making the coil bulkier. The coil would then be less adapted to fit closely against the surface of the body 3 which is a considerable disadvantage where the body 3 is a patient and the coil is required to be placed under the patient between the patient and the support for the patient, as indicated in FIG. 1. Such an arrangement is typically used where it is desired to obtain an image of a slice of a patient containing a length of the patient's spine.

A further advantage of the coil 17 over other known magnetic resonance imaging surface r.f. coils is that it is equally responsive to changes in field all along its axial length, i.e. there are no local minima in the coil's response.

It will be appreciated that whilst in the coil 17 shown in FIG. 2 the faces 29 and 31 are rectangular, coils with main faces of other shapes may be used in other arrangements according to the invention e.g. to suit particular anatomical sites. Moreover, the former 27, and hence the coil 17 may be made of flexible material to allow it to conform to a surface.

Furthermore, whilst the parts of the conductor 25 on the main faces 29, 31 of the former 27 are equally spaced along the length of the former 27 in the coil of FIG. 2, in other arrangements the spacing may vary along the length of the coil, e.g. to tailor the coil response to a particular anatomical site, or minimise edge effects.

Figure 3:
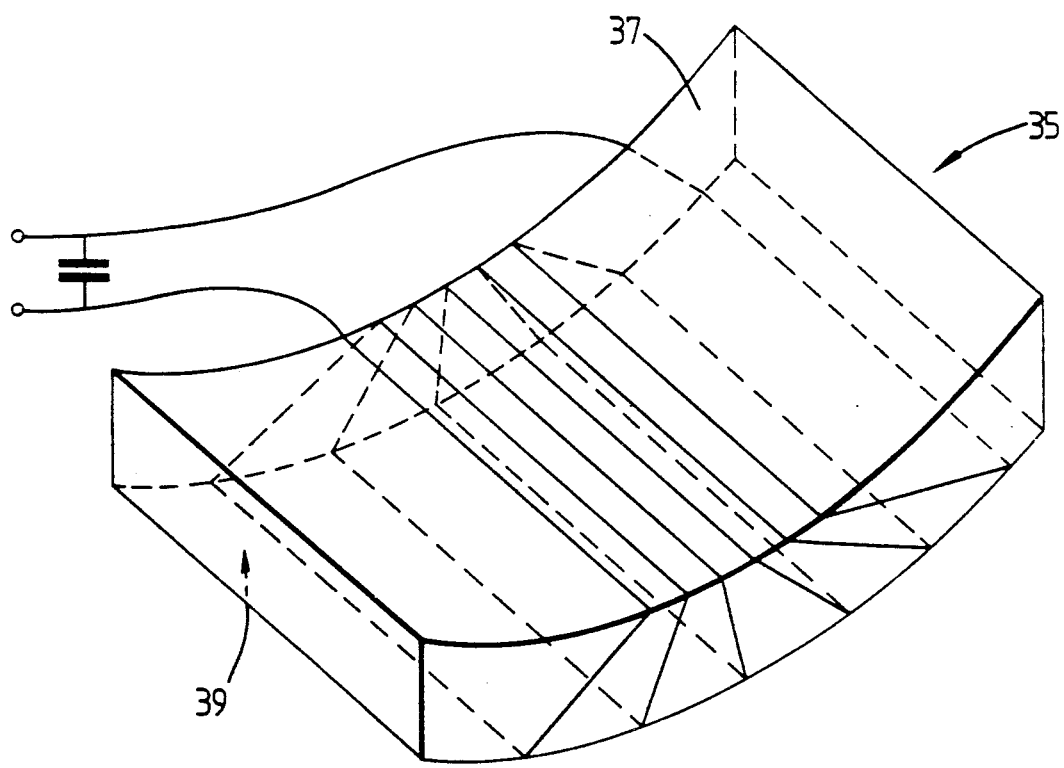
FIG. 3 is a diagrammatic perspective view of an alternative form for the r.f. coil.

Moreover, whilst the former 27, and therefore the faces 29, 31 are flat in the coil 17 of FIG. 2, in other arrangements there may be used a coil 35 (see FIG. 3) whose main faces 37, 39 are curved convexly and/or concavely to fit around a surface of the part of a body e.g. a limb or knee point of a patient. It will be understood that, in accordance with the invention, in the coil 35 the parts of the coil on the main face 37 are closer together than the parts on the main face 39 by an amount more than arises naturally due to the curvature of the faces 37, 39.

It will be appreciated that when the coil 17 of FIG. 2 is energised it produces a field parallel to its axis, and hence orthogonal to the static field direction, which is stronger adjacent the face 29 than the face 31. Similarly the coil 35 of FIG. 3 produces a field generally parallel to its axis which is stronger adjacent the face 37 than the face 39. Thus a coil according to the invention can be employed as an r.f. transmitting coil in magnetic resonance apparatus with similar advantages to those described above in relation to its use as an r.f. receiving coil. However, due to the advantages of placing an r.f. receiving coil as close as possible to the region of a body being examined to increase signal-to-noise ratio, the more important application of a coil according to the invention is likely to be as an r.f. receiving coil.

I claim:

1. A coil for use as an r.f. coil in a magnetic resonance apparatus comprising a conductor wound helically to form a coil of laminar overall form having a plurality of turns each of which includes a first part on a first main face of the coil and a second part on a second main face of the coil parallel to said first main face, said first parts of the coil being more closely spaced to one another than are said second parts of the coil such that said first parts taken together span a distance along the axis of the coil less than that spanned by the second parts of the coil taken together.

2. A coil according to claim 1 wherein said conductor is supported on a former.

3. A coil according to claim 2 wherein at least said one main face is at least partly curved.

4. A coil according to claim 2, wherein said coil and former are flexible.

5. A coil according to claim 1 wherein said main faces are substantially rectangular and said parts of the conductor extend substantially parallel to one another and substantially orthogonal to one pair of opposite edges of each main face.

6. A magnetic resonance apparatus comprising: means for generating a static magnetic field to define an equilibrium axis of magnetic alignment in a region of a body to be examined using the apparatus; and an r.f. coil of laminar overall form comprising a conductor wound helically to form said coil, said coil being positioned with a main face closely adjacent a surface of the body adjacent said region with its axis substantially orthogonal to the direction of said static magnetic field.

7. An apparatus according to claim 6 wherein said coil has a plurality of turns each of which includes a first part on a first main face of the coil and a second part on a second main face of the coil parallel to said first main face, said first parts of the coil are more closely spaced to one another than are said second parts of the coil such that said first parts taken together span a distance along the axis of the coil less than that spanned by the second parts of the coil taken together, and said coil is positioned with said one main face closely adjacent said surface of the body.

8. An apparatus according to claim 6 wherein said coil is a receiving coil arranged to detect magnetic resonance excited in the body in use of the apparatus.

9. An apparatus according to claim 6 adapted for examination of an elongated body wherein said means for generating a static magnetic field produces a magnetic field directed transverse to the longitudinal axis of said body.

10. An apparatus according to claim 9 wherein said means for generating a static magnetic field produces said static magnetic field in a gap between a pair of pole pieces, said body being positioned in said gap in use of the apparatus.

11. A method of examining a region of a body using magnetic resonance techniques comprising disposing the body in a static magnetic field; positioning alongside said body a coil of laminar overall form comprising a conductor wound helically to form said coil, said coil being positioned with a main face closely adjacent a surface of the body adjacent said region with its axis substantially orthogonal to the direction of said static magnetic field; and utilizing said coil to excite and/or detect magnetic resonance in said region.

12. A method according to claim 11 wherein said coil has a plurality of turns each of which includes a first part on a first main face of the coil and a second part on a second main face of the coil parallel to said first main face, said first parts of the coil are more closely spaced to one another than are said second parts of the coil such that said first parts taken together span a distance along the axis of the coil less than that spanned by the second parts of the coil taken together, and said positioning step comprises positioning said coil with said one main face closely adjacent said surface of the body.

* * * * *